(12) United States Patent
Hegazy et al.

(10) Patent No.: US 7,340,703 B2
(45) Date of Patent: Mar. 4, 2008

(54) TEST STRUCTURES AND METHOD FOR INTERCONNECT IMPEDANCE PROPERTY EXTRACTION

(76) Inventors: Hazem Mahmoud Hegazy, 34 Naser Khisro St., Nacr city, Cairo (EG); Amr M. E. Safwat, 179 Masaken Elremaya Estesmari, App#61, Elremayah square, Elgiza (EG) 12561; Wael Fikry Farouk Fikry Abdalla, 51 Birut St. Heleiopolis, Cairo (EG)

( * ) Notice: Subject to any disclaimer, the term of this patent is extended or adjusted under 35 U.S.C. 154(b) by 422 days.

(21) Appl. No.: 10/975,717

(22) Filed: Oct. 26, 2004

(65) Prior Publication Data

US 2006/0022678 A1 Feb. 2, 2006

Related U.S. Application Data

(60) Provisional application No. 60/598,703, filed on Aug. 2, 2004.

(51) Int. Cl.
*G06F 17/50* (2006.01)
(52) U.S. Cl. .......................................................... 716/5
(58) Field of Classification Search ..................... 716/5
See application file for complete search history.

(56) References Cited

U.S. PATENT DOCUMENTS

| | | | |
|---|---|---|---|
| 5,901,063 A * | 5/1999 | Chang et al. ................... | 716/4 |
| 6,022,750 A | 2/2000 | Akram et al. | |
| 6,381,730 B1 * | 4/2002 | Chang et al. ................... | 716/5 |
| 6,434,724 B1 | 8/2002 | Chang et al. | |
| 6,453,444 B1 | 9/2002 | Shepard | |
| 6,462,396 B2 | 10/2002 | Lemaire | |
| 6,588,002 B1 | 7/2003 | Lampaert et al. | |
| 6,594,604 B2 | 7/2003 | Metzger et al. | |
| 6,643,831 B2 | 11/2003 | Chang et al. | |
| 2001/0000948 A1 | 5/2001 | Chen | |
| 2001/0033177 A1 | 10/2001 | Lindolf et al. | |
| 2002/0104063 A1 | 8/2002 | Chang et al. | |

OTHER PUBLICATIONS

Deutsch et al., "Functional High-Speed Characterization and Modeling of a Six-Layer Copper Wiring Structure and Performance Comparison With Aluminum On-Chip Interconnections," IEEE, 1998, pp. 295-298.

(Continued)

*Primary Examiner*—Jack Chiang
*Assistant Examiner*—Brandon Bowers
(74) *Attorney, Agent, or Firm*—Klarquist Sparkman, LLP

(57) ABSTRACT

A method and test structures are disclosed for characterizing interconnects of an integrated circuit. The method provides a set of test structures and determines a unit impedance property of each test structure, desirably using S-parameter measurements. A reference impedance data set is then formulated that characterizes the impedance of an integrated circuit manufacturing technology and that can be used to characterize the impedance of interconnects of the chip made by the technology. Each test structure desirably comprises a ground grid and a signal line, and is characterized by values of a set of predetermined attributes such as layer location of the respective ground grid, grid density, layer association, width and length of the respective signal line.

54 Claims, 4 Drawing Sheets

OTHER PUBLICATIONS

Zhu, "On-chip Inductance Modelling, Analysis and Simulation," UC, San Diego, 2000, pp. 3-13.

Xu and He, "An Efficient Model for Frequency-Dependent On-Chip Inductance," U. of Wisc., Madison, WI.

"Is Inductance Becoming Critical for Deep Submicron Interconnect," Technology White Paper, Sequence Design, Inc., 2002, pp. 2-6.

"Via Inductance", High Speed Digital Design Archives, vol. 6, Issue 04, 2003.

Dr. Howard Johnson, "Return Current in Plane", High Speed Digital Design Archives, vol. 3, Issue 11, 1999.

William D. Kimmel and Daryl D. Gerke, "The Return Path: Impedance Control on Printed Circuit Boards," CE Mag., 2002.

Ortiz et al., "Mutual Inductance Extraction and the Dipole Approximation".

Michael W. Beattie and Lawrence T. Pileggi, "Inductance 101: Modeling and Extraction," Carnegie Mellon, 2001.

Beattie et al., Reproduction of Overheads, "Inductance 101: Modeling and Extraction," Carnegie Mellon.

A.E. Ruehll, "Inductance Calculations in a Complex Integrated Circuit Environment," IBM J. Res. Develop., Sep. 1972, pp. 470-481.

Jerry Tallinger and Haris Basit, "Tools for On-Chip Interconnect Inductance Extraction," OEA International, Inc., 2002.

Richard Goering, "Inductance Nags, Tools Lag in 0.13-micron ICs," EE Times, Oct. 1, 2001.

Gala et al., "Inductance 101: Analysis and Design Issues," Motorola, Inc., Austin, TX.

Restle et al., "Measurement and Modeling of On-Chip Transmission Line Effects in a 400 MHz Microprocessor," IEEE, 1998, pp. 662-665.

Eisenstadt et al., "S-Parameter-Based IC Interconnect Transmission Line Characterization," IEEE, 1992, pp. 483-490.

Yi-Chi Shih, "Broadband Characterization of Conductor-Backed Coplanar Waveguide Using Accurate On-Water Measurement Techniques," Microwave Journal, Apr. 1991, pp. 95-104.

Soumyanath et al., "Accurate On-Chip Interconnect Evaluation : A Time-Domain Technique," IEEE, 1999, pp. 623-631.

Kleveland et al., "High-Frequency Characterization of On-Chip Digital Interconnects," IEEE, 2002, pp. 716-725.

Escovar et al., "Mutual Inductance Extraction and Dipole Approximation", ISPD'04, Apr. 18, 2004.

\* cited by examiner

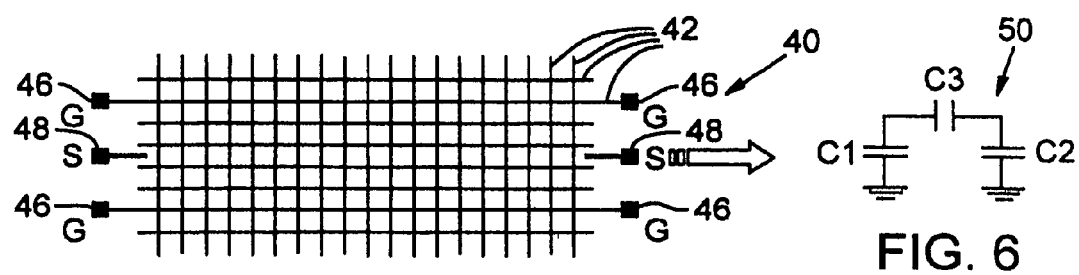
FIG. 5
FIG. 6
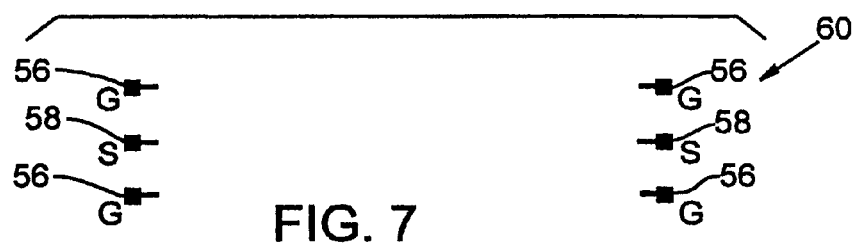
FIG. 7
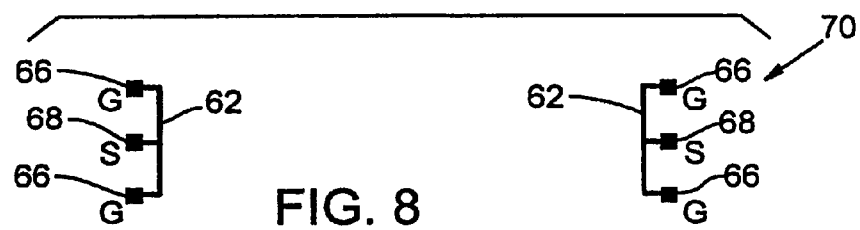
FIG. 8

TEST STRUCTURES AND METHOD FOR INTERCONNECT IMPEDANCE PROPERTY EXTRACTION

RELATED APPLICATION DATA

This application claims the benefit of U.S. provisional patent application No. 60/598,703, filed Aug. 2, 2004, entitled, "Test Structures and Method for Interconnect Impedance Property Extraction", by Hazem Hegazy, Amr M. E. Safwat, and Wael Fikry Farouk Fikry Abdalla, which is hereby incorporated by reference.

BACKGROUND

The present disclosure relates to techniques for extracting interconnect impedance properties, such as inductance, of an integrated circuit.

Metal interconnects are an important part of integrated circuits. Partly because on-chip metal interconnects tend to be denser, faster, and more reliable than off-chip connections, there is a continuing drive toward higher levels of chip integrations. This continuing drive in turn places more and more stringent requirements on the properties of on-chip metal interconnects.

Metal interconnects play several crucial roles including forming signal lines and providing networks for power distribution and ground distribution. An ideal metal interconnect should play no active role in the integrated circuit other than conducting electrons, but actual metal interconnects are not ideal. Real metal interconnects are characterized by matrices of resistance (R), inductance (L), capacitance (C), and conductance (G). Each of these fundamental impedance properties could be a factor that must be taken into account in the design of the integrated circuit. This requires that the designers of the integrated circuit have knowledge of these impedance properties with respect to a certain design layout of the integrated circuit. Specific knowledge of these impedance properties is required to check, commonly using a computational simulation and modeling method, whether a particular design meets the design objective. If it does, the design is accepted. If it does not, changes are made in the design, interconnect impedance properties of the new design are obtained if necessary, and additional simulation is performed. The process is repeated until a satisfactory design is achieved.

One of the impedance (R, L, C and G) related effects of metal interconnects is signal delay. As the signal switching speeds exceed 1 GHz and chip densities exceed tens of millions of transistors, signal delay caused by the on-chip metal interconnects becomes significant. Interconnect signal delay may be contributed by any impedance properties. RC delay (delay caused by resistance and capacitance), for example, has prompted an industry-wide shift from aluminum to copper interconnects to reduce the resistance, and a search for a dielectric material with low-permittivity to reduce the capacitance. However, although use of better materials may reduce the RC delay, it does not eliminate them. In addition, these measures are less effective in reducing the delays dominated by inductance.

In particular, as operating frequencies of integrated circuits continue to rise, the effect of inductance on circuit performance is becoming increasingly important, requiring a more complete RLC model for simulation. For example, high-speed VLSI exhibits subnanosecond switching and requires clock signal propagation bandwidth above 1 GHz in order to maintain rise times. Under such frequency ranges, the self inductance of a signal wire can create a signal-delay problem.

In addition to causing signal delay, inductance also contributes signal noise in an integrated circuit. Signal noise and cross-talk largely relate to the mutual inductance among neighboring signal wires and may create signal-integrity problems. As has been observed in early high-speed microprocessors (P. J. Restle et al., "*Measurement and modeling of on-chip transmission line effects in a 400 MHz microprocessor,*" *IEEE Journal of solid-state circuits,* vol. 33, no. 4, April 1998, pp. 662-665), inductance is believed to be a main contributor to Simultaneous Switching Noise (SSN) in high-speed VLSI designs.

Correspondingly, the effective modeling and analysis of impedance, particularly that of inductance, has become an issue of great interest for high-speed circuit designing over the years to suit the ever-higher operation frequency. This has created a growing need for extracting interconnect impedance properties (R, L, C and G) to be used with development tools such as electronic design automation (EDA) software for creating, simulating, and verifying designs.

BRIEF SUMMARY OF THE DISCLOSURE

The present disclosure provides a method and test structures used in characterizing interconnects of an integrated circuit. The method can be used to extract impedance data, such as inductance data, of an integrated circuit. The method provides a set of test structures and determines a unit impedance property of each test structure. Each test structure desirably comprises a ground grid and a signal line, and is characterized by values of a set of predetermined attributes. A reference impedance data set is then formulated from the determined unit impedance properties of the set of test structures, wherein the reference impedance data set is curve-fit according to the set of attributes. The impedance property of an interconnect segment in the integrated circuit is then determined by identifying the interconnect segment with a curve point in the curve-fit reference impedance data.

In one embodiment, the set of predetermined attributes that characterizes the test structures includes layer location of the respective ground grid among a plurality of metal layers, grid density of the respective ground grid, layer association of the respective signal line among the plurality of metal layers, width of the respective signal line, and length of the respective signal line. The values of the set of predetermined attributes are selected according to the technology profile used for fabricating the integrated circuit that is being characterized. Preferably, the values have sufficient diversity to represent the technology profile such that the method is technology-profile independent.

In one embodiment, the unit impedance property of the test structures is determined by an S-parameter method that characterizes the line transmission properties of a certain signal line in the test structure.

Also disclosed herein is a set of test structures used for characterizing interconnects of an integrated circuit fabricated according to a technology profile. In a specific example disclosed herein, the technology profile defines a metal layer configuration having at least five metal layers including a top metal layer. The set of test structures includes subsets of test structures to represent each metal layer. Each subset has test structures having a ground grid formed in the top metal layer and a signal line formed in a respective metal layer. Each subset of test structures comprises at least two test structures that are each characterized by values of the set of attributes predetermined according to the technology profile, such that the two structures are different from one another with respect to at least one attribute but both still within a range determined by the technology profile.

The disclosed methods and structures can be used to characterize a technology and the characterization results can be used for extracting impedance properties of any IC made with the technology.

Other features and advantages of the disclosed methods and structures will become more readily understandable from the following detailed description and figures.

BRIEF DESCRIPTION OF THE DRAWINGS

The present disclosure describes a method and related test structures for extracting interconnect impedance properties of an integrated circuit that will be described in detail along with the following figures, in which like parts are denoted with like reference numerals or letters.

FIG. 5 is an open circuit structure for de-embedding.

FIG. 6 is an equivalent circuit of the open circuit structure in FIG. 5.

FIG. 7 is a different open circuit structure for de-embedding the standard surface structure shown in FIG. 4.

FIG. 8 is a short circuit structure used to further de-embed the standard surface structure.

DETAILED DESCRIPTION

A. Terms

Figure 1:
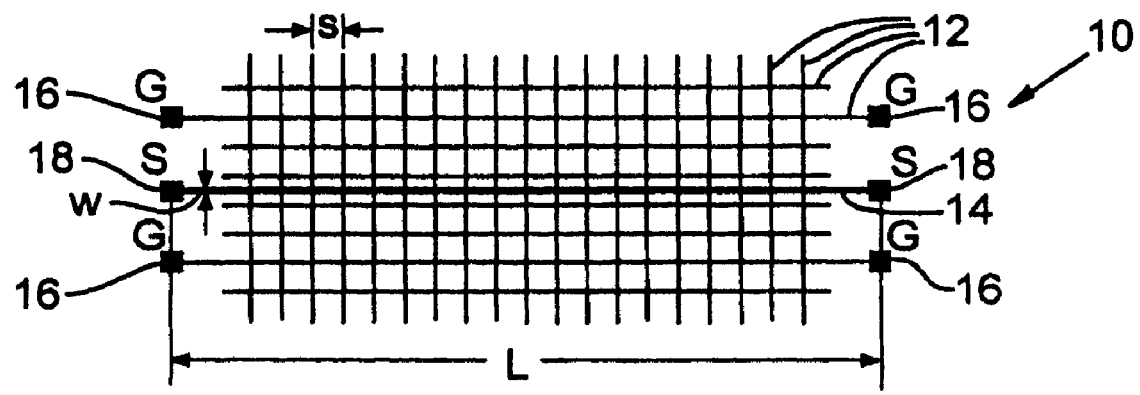
FIG. 1 is a schematic top view of an exemplary form of test structure with a ground grid and a signal line on the top metal layer.

In the present description, the term "impedance" broadly encompasses any quantity that characterizes the input/output relationship such as the amount of reflection relative to transmission. For electric impedance, impedance encompasses resistance, capacitance, inductance and conductance. Under an AC condition, impedance can be a complex quantity. Any linear sinusoidal driven combination of capacitors, inductors, resistors has a steady state solution of the form $$I = I_0 \cos(wt + \phi), \quad (1)$$

which can be found using a complex impedance Z defined by $$Z \equiv \frac{V}{I}, \quad (2)$$

where for capacitors, $$Z \equiv \frac{V}{I} = -\frac{i}{wC}. \quad (3)$$

For inductors, $$Z \equiv \frac{V}{I} = iwL \quad (4)$$

For resistors, the impedance is simply equal to the resistance R, $$Z = R. \quad (5)$$

The term "integrated circuit" has the ordinary meaning as understood in the art. An integrated circuit may be, but is not limited to, a microprocessor, an application-specific integrated circuit (ASIC), a programmable logic device (PLDs) such as a field programmable gate arrays (FPGA), a system-on-chip (SoC), or a memory device. The disclosed embodiments can be applied to any integrated circuit that has multiple layers of metal interconnects where impedance, such as inductance, may cause signal delay or affect signal integrity and thus needs to be analyzed, characterized or extracted. The extracted impedance data or knowledge may be used as an input for further designs steps, either separately or integrally, manually or automatically.

In addition, the use of the terms "attributes" and "values of attributes" is to be understood within the context of this disclosure and does not invoke the strict meaning of these terms in mathematics such as Hubert space and relational databases. For example, the use of these terms in the present disclosure does not imply that attributes and tuples (sets of attribute values describing particular entities) must observe normalization and the uniqueness rules.

In the present disclosure, a systematically designed series of test structures is called "a set" of test structures. A set of test structures having certain characteristics is deemed to exist or be "provided" whenever each recited test structure is present or is made available, regardless of whether additional structures may also co-exist or supplied together with the described set of test structures, and regardless of whether such additional structures are structurally connected and inseparable with the recited set of test structures.

The term "include" when used herein has the same broad meaning as the word "comprise".

In addition, the term "grid" when used herein refers to a plurality of interconnected electrical conductors arranged in a pattern over a specific area, desirably in a single layer or ground plane of a multilayered semiconductor structure. The term includes both crisscrossed and non-crisscrossed patterns, although a crisscrossed pattern may be preferred for better connectivity and routing efficiency. With a crisscrossed pattern, the conductors are typically orthogonally arranged to form a network having electrically conductive metal paths. However, other patterns may be used.

A. An Overview of the Disclosure

To better appreciate the significance and advantages of the present disclosure, an introduction to an exemplary integrated circuit design process into which the present disclosure may be applied is provided in the following.

In a typical process of designing an integrated circuit, the designer first uses a high level hardware description language (e.g. Verilog or VHDL) to specify the functions and logic requirements of the integrated circuit. A logic circuit is then synthesized to a logic gate level circuit description, commonly using an automatic logic synthesis tool. If the synthesized logic circuit at the logic gate level satisfies a preliminary verification and timing analysis, a layout form of the circuit under design is then created for actual physical implementation. The layout process is a placing and routing process in which the logic elements of the logic gate level circuit description are realized (placed) in a physical implementation of the circuit elements, which then are connected (routed) using interconnecting lines. The layout of the device specifies all of the semiconductor device layout parameters and contains geometric features, such as polygons, to indicate proper size, shape, location and separation of a certain circuit physical feature (e.g., a sub-component within a semiconductor device) from other physical features or to indicate proper isolation and separation among the circuit elements. Furthermore, the layout of a typical semiconductor device contains multiple layers, each layer having one or more polygons for placing and routing. Generally, the more complicated the device is, the more layers and polygons the layout includes.

Once laid out, a more realistic estimate of parasitic impedances and timing analysis is carried out using the layout of the integrated circuit.

One aspect of the present disclosure derives from a realization by the inventors that a series of test structures can be designed and tested to systematically characterize interconnect impedance properties of a technology used for fabricating integrated circuits. The knowledge or data of the interconnect impedance properties of the technology learned from the test structures can be used to extract impedance properties of any integrated circuit that is fabricated using the characterized technology.

A technology for fabricating integrated circuits is described by a technology profile that defines certain fixed features and certain variable features. The fixed features may include, for example, the number of metal interconnect layers, layer thicknesses, physical properties (e.g., metal resistivities) of the metal materials used, and physical properties (e.g., dielectric constants) of the dielectric materials used, while the variable features may include line spacings (or line separation) and interconnect line widths on each metal layer. Typically, variable features fall within a range between a minimum value and maximum value defined by the technology profile.

According to one aspect of the present disclosure, test structures desirably share a basic common configuration to approximate the fixed features of technology being characterized, while individual test structures may each have one or more additional features. These additional features are desirably systematically different from one another in the same set of test structures, such that individual test structures each represent a certain aspect of the technology profile and the set of test structures together provide a more complete representation of the technology profile.

Another aspect of the present disclosure relates to regarding the metal layers in an IC design as sections of transmission lines that can be characterized through transmission measurements such as S-parameter measurements. For example, in a standard Digital ASIC design, power and ground grids constitute a network on the top metal layers. In addition, usually, metal lines in one layer are perpendicular to metal lines in adjacent layers (below and above) to reduce coupling between successive layers without sacrificing routing efficiency. Given a common ground, these metal layers can be regarded as sections of transmission lines and the interconnect network can be characterized through S-parameter measurements. Accordingly, the present disclosure describes an embodiment of a method using test structures that desirably each define a layer-specific transmission line but all have a common ground grid. The method of this embodiment systematically characterizes layer-specific signal line elements (conductors) defined by a technology profile.

The method according to the present disclosure is particularly suited for automatic CAD tools used in integrated circuit design processes such as discussed below.

A layout of an integrated circuit is typically in digital format which can be automatically scanned by a CAD tool to establish an interconnect impedance model that is then used in simulation to determine the signal propagation and delay behavior of the design. For example, a CAD tool may scan the layout, divide the scanned layout into small interconnect segments and then replace each segment by an equivalent circuit element such as an RLC circuit element, to establish an overall interconnect model. The accuracy of an interconnect model is largely determined by the accuracy of the RLC values prescribed to the RLC circuit elements. In a simplistic model, the RLC values may be determined by taking into account only the physical properties and dimensions of individual metal lines. However, due to the interconnection and boundary effects, such simplistic models deviate from the actual interconnect behavior of the real circuit.

Using test structures in accordance with embodiments of the present disclosure, however, RLC circuit elements are more accurately characterized by experimental measurements using methods such as the well-established S-parameter transmission measurements. Each test structure is desirably designed to specifically represent a line segment located in a specific metal interconnect layer and with a specific signal line width and a ground grid with a specific grid density. At the same time, the RLC values determined with respect to each test structure are realistic and inherently take into account at least some of the effects of the other part of the test structure on the specific line segment.

Test structures of the present disclosure are capable of more accurately and systematically characterizing the technology. In addition, the approaches disclosed herein desirably allow for a layer specific representation of line signal segments as a basis for characterizing the overall technology.

B. Disclosed Embodiments

Disclosed below are representative embodiments of a method and related test structures for extracting interconnect impedance properties of an integrated circuit. The disclosed methods should not be construed as limiting in any way. Instead, the present disclosure is directed toward all novel and nonobvious features and aspects of the various disclosed embodiments, alone and in various combinations and sub-combinations with one another. The methods are not limited to any specific aspect or feature or combinations thereof, nor do the disclosed methods require that any one or more specific advantages be present or problems be solved.

In particular, several representative embodiments of are disclosed herein using inductance extraction for purposes of illustration. The application of the present disclosure, however, is not limited to inductance extraction, but can be applied to extract other interconnect impedance properties as well.

1. Targeted Test Structures

FIG. 1 shows a schematic top view of an exemplary test structure 10 with ground grid 12 and signal line 14 on the top metal layer. The view shows metal interconnect arrangement on the top metal layer, including ground grid 12, ground pads 16 conductively attached thereto, signal line 14, and signal pads 18 conductively attached thereto. Ground grid 12 is networked to form a common ground for the metal interconnect network under test. Ground grid 12 has the grid density defined by spacing S between two adjacent parallel ground lines. Signal line 14 has length L and width W as illustrated.

Ground pads 16 and signal pads 18 are also referred to as external pads in this disclosure. These pads are used as conductive contacts accessible by external probes for applying input signals and making measurements of output (transmissive or reflective) signals, as will be further described below.

Test structure 10 is preferably fabricated using the same technology that is being characterized. For example, test structure 10 can be fabricated according to the technology profile to have substantially the same layer thickness of each metal layer, dielectric properties, and conductance properties as that of an integrated circuit under investigation. Unlike an actual integrated circuit, test structure 10 does not require and desirably lacks circuit elements such as transistors. Test structure 10 also does not require metal interconnects in metal layers other than in the metal layer containing signal line 16 (the top metal layer as shown in FIG. 1).

Figure 2:
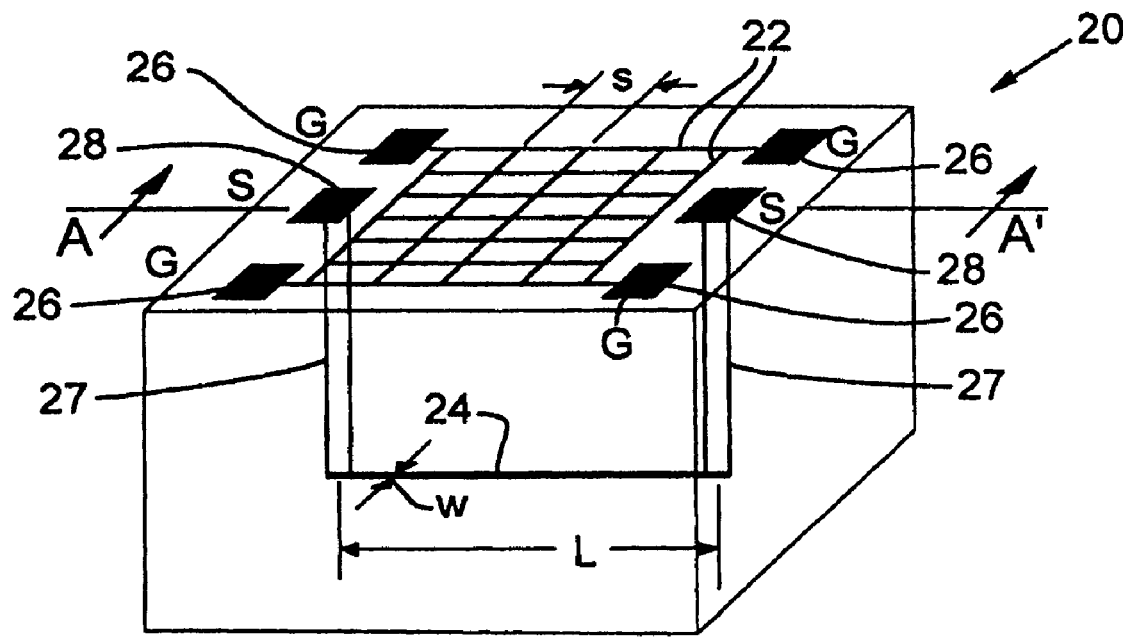
FIG. 2 is a schematic view of another test structure embodiment with a ground grid on the top metal layer and a signal line in a metal layer below the top metal layer.

FIG. 2 shows a schematic view of an alternative test structure 20 with ground grid 22 on the top metal layer and signal line 24 in a metal layer below the top metal layer. Similar to test structure 10 shown in FIG. 1, test structure 20 includes ground pads 26 conductively formed on ground grid 22, which is networked to form a common ground for the metal interconnect network under test. Ground grid 22 has a grid density defined by spacing S between two adjacent parallel ground lines. Signal line 24 has length L and width W as illustrated. Unlike test structure 10 where signal pads 18 are directly formed on signal line 14, signal line 24 and signal pads 28 in test structure 20 are connected through vias 27.

Figure 3:
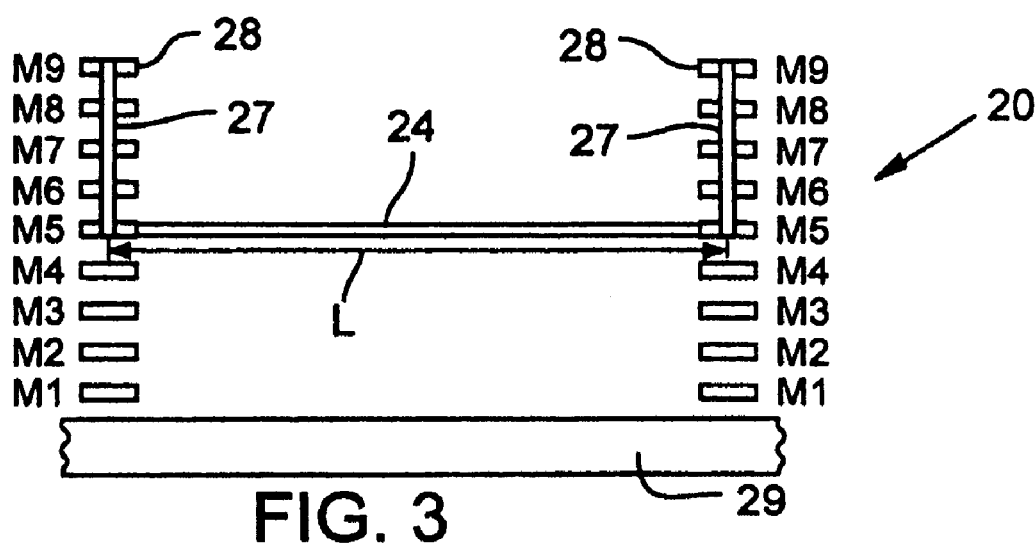
FIG. 3 is a schematic sectional view of the exemplary test structure of FIG. 2, taken along line A-A' in FIG. 2.

FIG. 3 shows a schematic sectional view of test structure 20 along line A-A' in FIG. 2. In the particular example shown in FIGS. 2-3, test structure 20 represents a technology that has nine metal interconnect layers, M1, M2, M3, M4, M5, M6, M7, M8 and M9, with M9 being the top metal layer. Signal line 24 in the example shown in FIG. 3 is built in the fifth metal interconnect layer (M5). Except for the via connection through vias 27, signal line 24 is solely contained in its respective metal layer (M5 in the example shown in FIG. 3) and is not connected to other metal layers. Signal line 24 having this characteristics is thus "associated" with its respective metal layer in accordance with the present disclosure.

A test structure in accordance with the present disclosure is thus desirably specified with several attributes, including a plurality of, and most desirably all of, the following attributes:

(1) layer location of the respective ground grid among a plurality of metal layers;

(2) grid density of the respective ground grid;

(3) line width of conductor lines in the ground grid;

(4) layer association of the respective signal line among the plurality of metal layers;

(5) width of the respective signal line; and (6) length of the respective signal line.

For example, in the particular test structure 10 shown in FIG. 1, ground grid 12 is located in the top metal layer, and signal line 14 is associated with the top metal layer as well. In the particular test structure 20 shown in FIGS. 2-3, ground grid 22 is located in the top metal layer, and signal line 24 is associated with the fifth metal layer M5.

Grid density is characterized by line spacing between adjacent lines in the ground grid. Line spacings in two orthogonal directions may or may not be the same. When line spacings in the two orthogonal directions are not the same, grid density may be better characterized by lines per unit area, or a percentage density compared to a standard density. Such variations in grid density determination are within the scope of the disclosure.

A set of test structures each similar to that illustrated in FIGS. 1-3 can be systematically designed to represent a technology for the purpose of extracting interconnect impedance properties of an integrated circuit. Each test structure in the set desirably has a ground grid and a signal line (and thereby encompasses plural signal lines as more than one can be present), and is characterized by respective values of a set of predetermined attributes. A unit impedance property of each test structure is then desirably determined using a testing method such as that described in later sections of this disclosure. The unit impedance property is desirably impedance per-unit length of the signal line.

The determined unit impedance properties of the set of test structures are then used to generate a reference impedance data set, which can be formulated according to the values of the set of attributes. Various ways of formulation may be used. One example is curve fitting, in which a continuous curve is generated using data extrapolation from multiple measurements with respect to an attribute. Alternatively, look-up tables of impedance values may be formulated based on the determined unit impedance properties of the test structures.

The formulated (e.g., curve-fit or look-up table or other format) reference impedance data set forms a basis for building an impedance model of a certain layout of an IC design for the purpose of simulation as described below.

For example, a layout of an IC design can be scanned by a CAD tool which divides the scanned layout into small interconnect segments. Each small interconnect segment is an RLC circuit element. An individual small interconnect segment is identified by several factors, such as physical width and length of a corresponding conductor segment, metal layer location of the conductor segment and grid density of the nearby power/ground network. This provides a correspondence between each small interconnect segment and a data point in the formulated reference impedance data set as described above.

Specifically, in the case of a curve-fit reference impedance data set example, the reference impedance data set is a result of extrapolation of the systematically designed set of test structures. In this case, the x-axis of the curves corresponds to a respective predetermined attribute of the test structures. At the same time, because the predetermined attributes of the test structures in this example correspond to the above-described factors identifying a small interconnect segment of the layout, the interconnect segment can be identified (or associated) with a curve point in the curve-fit reference impedance data. Through this association, the impedance values at the curve point is assigned, after a conversion from the unit length to the actual length of the small interconnect segment, to the respective interconnect segment that has been identified with the curve point. Similarly, extrapolations of data points from reference impedance data set stored in a look-up table may also be made to associate impedance values to interconnect segments.

The above procedure results in corresponding an RLC circuit element with specific impedance (RLC) values. The RLC circuit element with specific impedance values then replaces the respective small interconnect segment. For better accuracy, the same procedure is desirably performed for every small interconnect segment to form an overall interconnect model for further simulation.

Preferably, the ground grids of all test structures in the same set of test structures are all located in the same metal layer. For standard Digital ASIC design, the layer location of the ground grid in the test structures is desirably the top metal layer as shown in FIGS. 1-3. This is closer to the case of an actual ASIC where power and ground nets constitute a network on the very top metal layer.

Characterization of the technology in accordance with the present disclosure desirably has a layer-specific aspect with respect to the multiple metal interconnect layers defined by the technology. A subset of test structures can be selected to represent a targeted metal layer. The subset may include test structures having a ground grid formed in the top metal layer and a signal line formed in the respective metal layer. Desirably, there is at least one test structure for each metal layer to represent the associated metal layer that needs to be characterized. Such layer representation can be specific and unambiguous because test structures in accordance with the most desirable embodiment are layer-specific, meaning a particular test structure is always associated with the respective metal layer and not with other metal layers.

Desirably, a subset of test structures is provided in association with each metal layer to be characterized. Each subset desirably includes at least two test structures that are each characterized by values of the set of attributes, such that the two structures, which are associated with the same metal layer, are different from one another with respect to at least one attribute but both still within a range determined by the technology profile.

To fully characterize a technology, at least one test structure representing every metal layer defined by the technology may be used. For example, for a technology that has five metal interconnect layers (M1, M2, M3, M4, and M5), there may be at least one test structure to represent M1, at least one test structure to represent M2, and so on. However, although a full characterization of the technology is possible and may be desirable, partial characterization of the technology involving a selective number of metal layers of interest may be used.

Further, for the purpose of formulating reference impedance data (using either curve-fitting or look-up tables) with respect to a certain characterizing attribute of the test structures, there should desirably be at least two test structures that are different from one another with respect to that attribute. For example, a series of test structures each having a different ground grid density but the same layer association and signal line width may be used to obtain impedance data for formulating a curve describing an impedance-grid density dependence relation for the associated layer. Similarly, a series of test structures each having a different signal line width but the same layer association and ground grid density may be used to obtain impedance data for formulating a curve describing an impedance-signal line width dependence relation for the associated layer.

For attributes such as the signal line width that may have a relatively wide range depending upon the technology, the values of the attributes may require greater diversity throughout the range to sufficiently extrapolate a curve with respect to that attribute.

Because the values of the attributes, such as the width of the signal line, can be selected within a respective range defined by the technology regardless of the actual integrated circuit (IC) fabricated using the technology, exemplary methods in accordance with the present disclosure are technology dependent but IC independent. Test structures can be made and a characterization obtained for a given technology without regard to the specific IC to which the characterization applies. The result of the characterization (e.g., curve-fit or tabulated reference impedance data) may be applied for extracting impedance properties in any IC fabricated using the same technology.

The physical dimensions of the test structure are chosen based on several desirable considerations. First, the overall size of a test structure needs to accommodate physical measurements such as S-parameter measurements. Second, the height of the test structure (measured along the thickness direction of the wafer) should accommodate all necessary metal interconnect layers according to the technology that is being characterized. Third, the width of the test structure (measured along the transverse direction perpendicular to the signal line) should provide enough surrounding material around the signal line such that the behavior of the signal line on the test mimics that in a real IC. Fourth, the length of the test structure (measured along the signal line) should be large enough to accommodate relatively long signal lines in order to accurately determine impedance per-unit length using methods such as described below.

In an example where the technology to be characterized is TSMC 90 nm CMOS, a test structure is about 2 to 4 mm long and has a width from about 0.5 µm to 2 µm. Such an exemplary test structure thus has an elongated shape, resembling a vertical slice of the wafer.

Test structures may be fabricated separately and on different substrates. However, desirably a set of test structures for the purpose of characterizing a technology are fabricated on the same substrate, similar to that used for fabricating an actual IC using the same technology. In fact, signal lines such as illustrated in FIGS. 1-3 may simply be a selected portion of the metal interconnect lines built into the wafer using the same technology that is being characterized. Specifically, a segment of metal interconnect lines is selected and targeted, and cut-outs are made to facilitate adding necessary vias (e.g., 17 and 27 in FIGS. 1-3) that connect the targeted interconnect line segment (the signal line, e.g., 14 and 24 in FIGS. 1-3) to external signal pads (e.g., 18 and 28 in FIGS. 1-3). To avoid interference, desirably there should be no other signal lines directly between the targeted signal line and the ground grid (12 and 22 in FIGS. 1-3).

2. Test Structures of Different Signal Line Lengths

To determine impedance property per-unit length, it is necessary to have at least two test structures having different signal line lengths. Desirably, the two test structures differ from each other in the signal line length only but are identical with respect to other attributes. With a long test structure and a short test structure of such characteristics, the impedance per-unit length can be determined using various techniques such as described below.

According to a first exemplary technique, a propagation constant $\gamma$ is first calculated from the measured S-parameters of the long test structure and the short test structure that have identical transmission characteristics except for their different transmission line (signal line) lengths. S-parameter measurements are described in later section of this disclosure. Given the capacitance of these structures at low frequency and assuming capacitance is frequency independent, the inductance per unit length of the transmission line (signal line) can be readily determined.

According to a second exemplary technique, parasitic effects are first removed from the short test structure using de-embedding structures. De-embedding structures are described in the subsequent section of this disclosure. The de-embedded short structure is then modeled as an ideal transmission line where the impedance values per unit length, namely the resistance per-unit length (R), the inductance per unit length (L), the capacitance per-unit length (C), and the conductance per-unit length (G), are determined by electromagnetic field calculations (field solvers). The results can be verified using the S-parameter measurements of the long test structure. Specifically, frequency-dependant unit length RLCG values determined as described above are used to calculate transmission parameters of the long test structure. The results of the calculation are compared with the actual S-parameter measurements of the long test structure for verification. An agreement between the calculated transmission parameters of the long test structure and the actual S-parameter measurements of the long test structure indicates valid values of the determined per unit length RLCG values.

3. Standard Surface Structure

Figure 4:
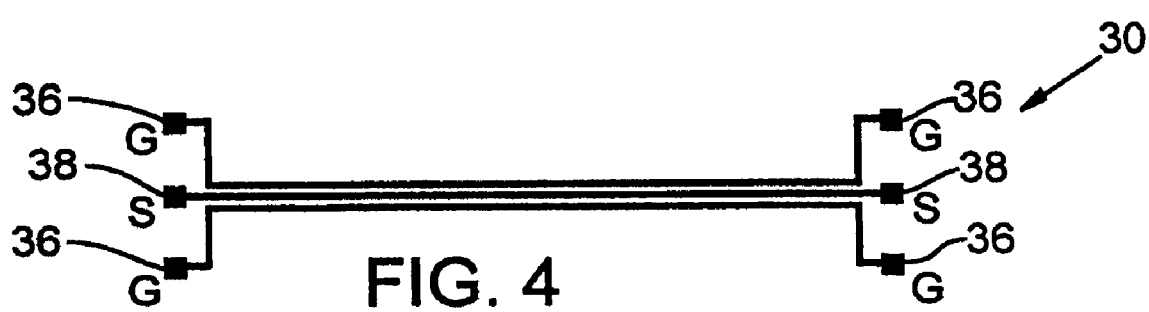
FIG. 4 is a standard surface structure without a ground grid.

For the purpose of comparison and de-embedding, a standard surface structure without a ground grid may also be used. FIG. 4 shows standard surface structure 30 that includes ground lines 32, ground pads 36 conductively connected thereto, signal line 34, and signal pads 38 conductively connected thereto. Standard surface structure 30 is similar to test structure 10 shown in FIG. 1 but does not have a ground grid.

4. De-embedding Test Structures

The use of external pads and vias, which are necessary for signal probing, generates parasitic effects in the measurements of the test structures and should be removed. De-embedding test structures are thus designed and tested along with the targeted test structures for the purpose of removing pad and via parasitic effects. Pad parasitics in the illustrated forms of test structures are approximated using capacitors, while via parasitics in test structures are approximated using inductors.

Pad parasitic effects are mainly capacitive due to their geometrical configurations and can be de-embedded by a direct open circuit structure measurement. FIG. 5 shows open circuit structure 40. Similar to test structure 10 in FIG. 1, open circuit structure 40 has ground grid 42 and ground pads 46 conductively attached thereto. Open circuit structure 40 also has signal pads 48. Unlike test structure 10, in structure 40 signal pads 48 are open circuited and not connected through a signal line.

FIG. 6 shows an equivalent circuit 50 to open circuit structure 40. Capacitors C1, C2 and C3 are equivalent parasitic capacitors introduced by signal pads 48. C1 equals C2 when signal pads 48 are identical on both sides, which is usually the case. C3 has a negligible value if signal pads 48 on both sides are separated by a long distance and thus the two probes probing through signal pads 48 are separated by a long distance. Open circuit structure 40 can be used as a global de-embedding structure for most test structures with all of the different signal line widths.

For de-embedding a standard surface structure such as structure 30 shown in FIG. 4, a different open circuit structure, shown in FIG. 7 as open circuit structure 60, may be used. Open circuit structure 60 for de-embedding standard surface structure 30 includes ground pads 56 and signal pads 58 which are unconnected to each other and thus form an open circuit structure. Similar to standard surface structure 30, open circuit structure 60 does not have a ground grid.

To further de-embed standard surface structure 30, a short circuit structure 70 such as shown in FIG. 8 may also be used. Short circuit structure 70 has ground pads 66 and signal pads 68, all shorted together using lines 62. Similar to open circuit structure 60, short circuit structure 70 does not have a ground grid. Open circuit structure 60 and short circuit structure 70 together are sufficient to obtain needed de-embedding data for standard surface structure 30.

C. S-parameter Measurements

Test structures systematically designed in accordance with the present disclosure are desirably treated as physical models of sectional transmission lines that can be characterized through transmission measurements such as S-parameter measurements.

Each test structure of the present disclosure can be tested as a two-port network with one port at each end of the signal line connected through the corresponding signal pads. Such a two-port network can be fully characterized through an S-parameter model shown in FIG. 9, in which S-parameters (Scattering Parameters) are shown. These parameters are the reflection and transmission coefficients between the incident and reflection waves. S-parameters include S11—input reflection coefficient, S21—forward transmission coefficient, S12—reverse transmission coefficient, and S22—output reflection coefficient, all of which can be measured by standard S-parameter measurement methods using transmission probes. S-parameters are usually measured in a controlled 50-Ω measurement system which is readily able to characterize high-frequency responses of interconnects.

Figure 10:
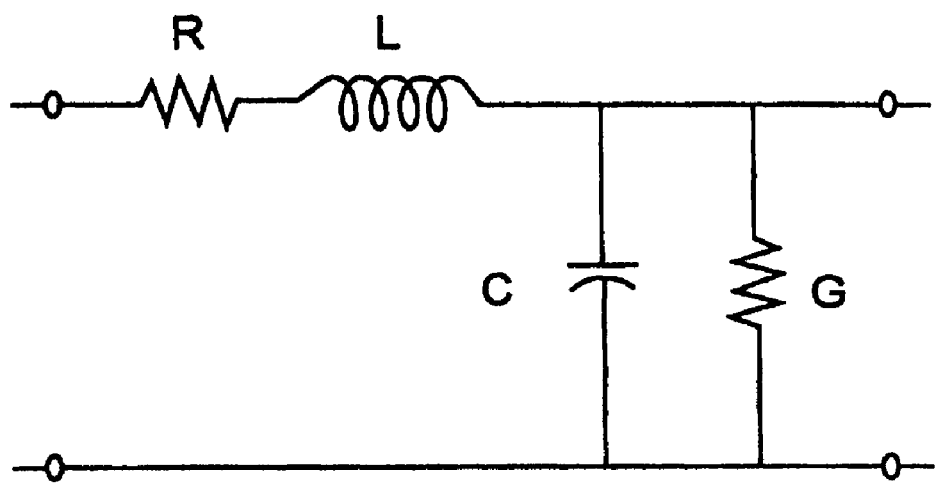
FIG. 10 is an equivalent circuit representing the two-port network in FIG. 9.

At the same time, the two-port network that corresponds to a test structure can be regarded as an equivalent circuit shown in FIG. 10. This model is known as Telegrapher's model and is a representation of a single conductor interconnect model for a test structure. More strictly speaking, FIG. 10 represents an infinitely small subsection of the model incorporating distributed circuit elements that describe per-unit length values instead of lumped element values.

Figure 9:
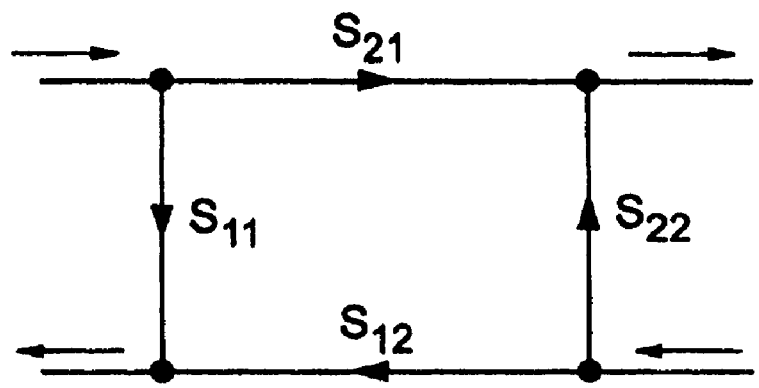
FIG. 9 is an S-parameter model characterizing a two-port network.

The equivalence between the S-parameter model in FIG. 9 and RLCG circuit model in FIG. 10 provides a basis for calculating impedance properties (RLCG values) from the measured S-parameters. The calculations are based on the solution of the classic Telegrapher's transmission line equation. Models have been developed that present, in the frequency domain, the interconnect voltage and current in terms of propagation constant γ and characteristic impedance Z. The impedance Z and propagation constant γ are then described by four distributed transmission line parameters, R, L, C, and G. The values of these distributed transmission line parameters R, L, C and G are then derived from, based on a given model, the measured S-parameters.

S-parameters describe completely the behavior of a network under linear conditions at a certain frequency range. Each parameter is typically characterized by magnitude, decibel and phase. For S-parameters that are measured as voltage ratios of the waves, the expression in decibel is $20\log(S_{ij})$. The advantage of S-parameters does not only lie in the complete description of the device performance at a certain frequency range, but also in the ability to convert to other parameters such as hybrid (H) or admittance (Y) parameters. Additionally, the stability factor (K) and many gain parameters can be computed.

Further details of S-parameter based transmission line characterization can be found, for example, William R.

Eisenstadt, et al., "S-parameter Based on IC Interconnect Transmission Line Characterization," IEEE Transactions on Components, Hybrids, and Manufacturing Technology, Vol. 15, No. 4, August 1992; and U.S. Pat. No. 6,594,604 to Metzger et al., which article and patent are hereby incorporated by reference to the extent they describe S-parameter based transmission line characterization methods.

In principle, using S-parameter measurements, the method in accordance with the present disclosure may be used for extracting any of R, L, C, and G values. The method is particularly useful for extracting inductance (L) values because the values of R, C, and G may be readily extracted using other more easily implemented methods. For example, line capacitance (C) can be measured accurately by RLC meters with accuracy up to 0.01 fF.

D. EXAMPLE

For inductance (L) extraction of a TSMC 90 nm CMOS technology, a test chip containing 30 test structures was made. The 30 test structures include 20 test structures targeting layer-specific transmission lines (signal lines) and six test structures for parasitic removal. The 24 test structures targeting transmission lines are made of 12 different configurations. Each configuration has two different signal line lengths. Some of the test structures targeting transmission lines are coplanar waveguide like test structures, like the structure shown in FIG. 1, where the signal and ground lines lie on the same surface, specifically the top metal layer metal 9 (M9). Other test structures targeting transmission lines are microstrip like test structures, like the structure shown in FIG. 2, where the ground grid lies on metal 9 and the signal line is on a different metal layer that is being targeted.

All 30 test structures in this example were made on the same test chip.

TABLE 1 shows the measured inductance of 10 different configurations of transmission lines and two short circuit structures with short-circuited pads. The other two of the 12 different configurations, L6/L18 and L12/L24, are not shown due to defects in the test chip that was used.

The above exemplary test structures do not represent every metal layer defined by the technology, and in addition only represent two data-points on grid density or signal line width. The test structures nevertheless provide a useful characterization of the technology.

Figure 11:
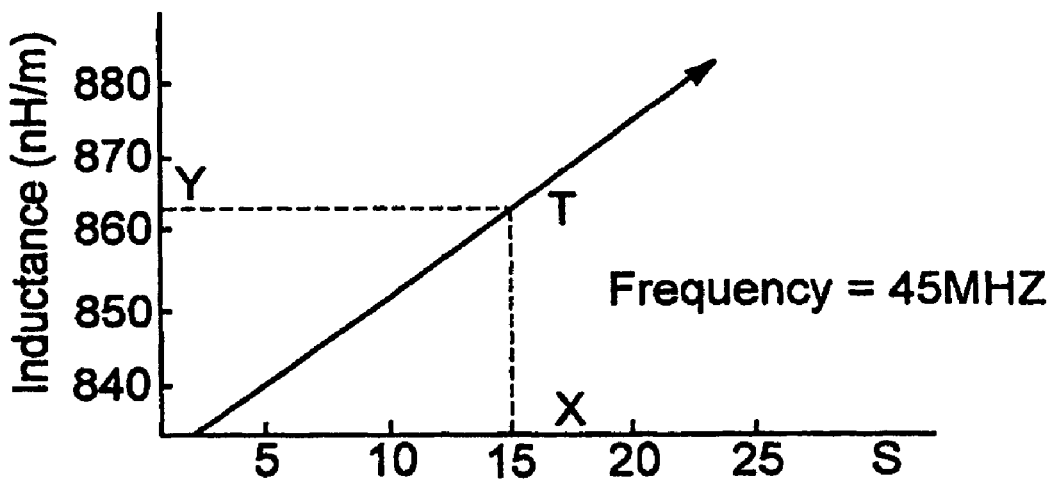
FIG. 11 is an exemplary curve formulated with respect to ground grid line spacing using the measurements for several test structures.

For example, FIG. 11 shows a curve formulated with respect to ground grid line spacing (a parameter for grid density) using the measurements for configuration L1/L13 (first row in TABLE 1) at 45 MHz and the measurements for configuration L2/L14 (second row in TABLE 1) at the same frequency. These two configurations constitute a subset of test structures that represents a signal line of a 5 μm width located in M1.

The formulated curve in FIG. 11 can be applied to extract an inductance of an interconnect line segment in an actual IC. Specifically, the formulated curve in FIG. 11 is applicable to an interconnect line segment that is also of a 5 μm width and located in M1. In a hypothetical case, assuming the IC has a ground grid lines spacing of 15 μm, the unit length inductance of this interconnect line segment can be determined to be the inductance value of point Y by associating the interconnect line segment with point X on the x-axis and projecting to point T on the curve in FIG. 11.

For a more complete representation of the technology, more test structures may be used.

Some unexpected behaviors were observed in some of the test structures described above. These include a high-dielectric loss, large variation of the conductor loss with frequency, high effective dielectric constant, and inconsistent attenuation constant for identical structures. Nevertheless, the exemplary test structures provided a useful characterization of the technology used in fabricating the test chip.

Although multiple examples of embodiments have been disclosed, workers skilled in the art will recognize that changes may be made in form and detail without departing from the spirit and scope of the disclosure. We claim all such modifications that fall within the scope of the following claims.

We claim:

1. A method for extracting interconnect impedance properties of an integrated circuit, comprising:
providing a set of fabricated test structures, wherein each test structure comprises a ground grid and a signal line, and is characterized by values of a set of predetermined attributes;

TABLE 1

| | Structure Description | | | | | | |
|---|---|---|---|---|---|---|---|
| Structure label | Signal metal layer | Signal line width (μm) | Ground metal layer | Ground line width (μm) | Ground lines spacing (μm) | Ground grid density | Inductance nH/m (45 MHz-20 GHz |
| L1, L13 | M1 | 5 | M9 | 5 | 20 | 20% | 875-600 |
| L2, L14 | M1 | 5 | M9 | 5 | 5 | 50% | 840-600 |
| L3, L15 | M3 | 5 | M9 | 5 | 20 | 20% | 865-600 |
| L4, L16 | M3 | 5 | M9 | 5 | 5 | 50% | 840-480 |
| L5, L17 | M5 | 5 | M9 | 5 | 20 | 20% | 860-605 |
| L7, L19 | M8 | 5 | M9 | 5 | 20 | 20% | 810-480 |
| L8, L20 | M8 | 5 | M9 | 5 | 5 | 50% | 750-265 |
| L9, L21 | M9 | 2 | M9 | 12 | 20 | NA | 975-900 |
| L10, L22 | M9 | 5 | M9 | 12 | 20 | NA | 850-760 |
| L11, L23 | M9 | 5 | M9 | 12 | 5 | NA | 625-520 |
| L25, L26 (short-circuited) | M9 | 5 | M9 | NA | NA | NA | 933 | determining a unit impedance property of each test structure;

generating a reference impedance data set from the determined unit impedance properties of the set of test structures, wherein the reference impedance data set is formulated according to the values of the set of attributes; and determining an impedance property of an interconnect segment in the integrated circuit by identifying the interconnect segment with a data point of the reference impedance data.

2. The method of claim 1, the set of predetermined attributes include:

layer location of the respective ground grid among a plurality of metal layers;

grid density of the respective ground grid;

layer association of the respective signal line among the plurality of metal layers;

width of the respective signal line; and length of the respective signal line.

3. The method of claim 1, wherein determining a unit impedance property of each test structure comprises determining a unit inductance of each test structure.

4. The method of claim 1, wherein the ground grid is on a top metal layer of a plurality of metal layers.

5. The method of claim 1, wherein the set of test structures comprises a plurality of test structures each representing a metal layer of the plurality of metal layers, wherein the signal line of each representing test structure is on the represented metal layer.

6. The method of claim 1 used for extracting interconnect impedance properties of an integrated circuit fabricated according to a technology profile defining a metal layer configuration having at least a first, a second, a third, a fourth, and a top metal layer, wherein the set of test structures comprises:

a first subset of test structures each comprising a ground grid formed in the top metal layer and a signal line formed in the first metal layer;

a second subset of test structures each comprising a ground grid formed in the top metal layer and a signal line formed in the second metal layer;

a third subset of test structures each comprising a ground grid formed in the top metal layer and a signal line formed in the first metal layer; and a fourth subset of test structures each comprising a ground grid formed in the top metal layer and a signal line formed in the fourth metal layer;

wherein each subset of test structures comprises at least two test structures that are each characterized by the set of attributes, such that the two structures are different from one another with respect to at least one attribute but both still within a range determined by the technology profile.

7. The method of claim 1, wherein the set of test structures comprises a plurality of test structures each having a different ground grid density.

8. The method of claim 1, wherein the set of test structures comprises a plurality of test structures each having a different layer association of the respective signal line.

9. The method of claim 1, wherein the set of test structures comprises a plurality of test structures each having a different width of the respective signal line.

10. The method of claim 1, wherein the set of test structures comprises a plurality of test structures each having a different length of the respective signal line.

11. The method of claim 1, wherein the set of test structures comprises at least one test structure in which the ground grid and the signal line are located on two different metal layers, and wherein the ground grid and the signal line are connected through a via.

12. The method of claim 1, further comprising:

providing a technology profile of a manufacturing process used for fabricating the integrated circuit, wherein the technology profile is characterized by:

a total layer number of metal layers used for interconnect, a grid density for each metal layer that has transmission lines, and a range of line widths for each metal layer; and determining the set of attributes characterizing each test structure according to the technology profile such that the technology profile is sufficiently represented by the set of test structures for extracting interconnect inductance of the integrated circuit.

13. The method of claim 12, wherein the technology profile is sufficiently represented by the set of test structures for extracting interconnect impedance properties of the integrated circuit using an automatic procedure comprising a CAD tool, wherein automatic procedure is technology profile-dependent but chip design-independent.

14. The method of claim 13, wherein the reference impedance data set comprises a curve that is fit and extrapolated from the determined unit impedance of the set of test structures, such that the CAD tool can scan a design layout of the integrated circuit, compare a scan result with the curve, and approximately determine an impedance property of an interconnect segment in the integrated circuit.

15. The method of claim 12, wherein the technology profile is further characterized by layer thickness of each metal layer in the integrated circuit, dielectric property, such as dielectric constant, of a dielectric material used for fabricating the integrated circuit, and conductance property, such as resistivity, of a metal material used for the metal layers in the integrated circuit.

16. The method of claim 15, wherein the set of test structures are fabricated according to the technology profile to have a layer thickness of each metal layer, dielectric property, and inductance property that are substantially the same as that of the integrated circuit.

17. The method of claim 1, wherein determining the unit impedance of each test structure comprises performing a frequency domain scattering-parameter (S-parameter) measurement of the respective test structure.

18. The method of claim 17, wherein the ground grid and the signal line of each test structure are used as two separate ports during an S-parameter measurement.

19. The method of claim 1, wherein the set of test structures further comprises a standard structure in which the ground grid and the signal line are coplanar.

20. The method of claim 19, wherein the ground grid and the signal line of the standard structure are both on a top metal layer.

21. The method of claim 1, wherein the set of test structures further comprises a de-embedding test structure.

22. The method of claim 21, wherein the de-embedding test structure comprises an open circuit structure in which the signal line comprises two pads separated from one another forming an open circuit.

23. The method of claim 22, wherein the open circuit structure further comprises an open ground grid comprising ground pads separated from one another forming an open circuit.

24. The method of claim 1, wherein the set of test structures are fabricated on a chip using a technology and the integrated circuit is fabricated on a separate chip using the same technology.

25. The method of claim 1, wherein the reference impedance data set is curve-fit according to the values of the set of attributes.

26. The method of claim 1, wherein the reference impedance data set is formulated into one or more lookup tables according to the values of the set of attributes.

27. A method for extracting interconnect inductance of an integrated circuit, comprising:
 providing a technology profile of a manufacturing process used for fabricating an integrated circuit;
 providing a set of fabricated test structures, wherein each test structure comprises a ground grid and a signal line located in a respective metal layer, and is characterized by values of a set of predetermined attributes, wherein the values of the set of predetermined prominence have sufficient diversity such that the technology profile is represented by the set of test structures for extracting interconnect inductance of the integrated circuit; and
 determining an inductance of each test structure.

28. The method of claim 27, wherein the technology profile is characterized by:
 a total number of metal layers used for interconnect,
 a grid density for each metal layer that has transmission lines, and
 a range of line widths for each metal layer; and
 wherein the set of attributes characterizing each test structures include:
 layer location of the respective ground grid among the plurality of metal layers,
 grid density of the respective ground grid,
 layer association of the respective signal line among the plurality of metal layers,
 width of the respective signal line, and
 length of the respective signal line.

29. The method of claim 27, further comprising:
 generating a reference inductance data set from the determined inductances of the set of test structures, wherein the reference inductance data set is formulated according to the values of the attributes characterizing each test structure; and
 determining an inductance of an interconnect segment in the integrated circuit by identifying the interconnect segment with a data point in the reference inductance data.

30. The method of claim 27, wherein determining the inductance of each test structure comprises performing an S-parameter measurement of the respective test structure.

31. A method for extracting interconnect inductance from an integrated circuit, comprising:
 providing a set of fabricated test structures, wherein
 (a) each test structure comprises a ground grid and a signal line, the signal line being in a metal layer of a plurality of metal layers including a top metal layer, the ground grid being in the top metal layer;
 (b) each test structure is characterized by values of a set of predetermined attributes including:
 layer location of the respective ground grid among the plurality of metal layers,
 grid density of the respective ground grid,
 layer association of the respective signal line among the plurality of metal layers,
 width of the respective signal line, and
 length of the respective signal line, and (c) the set of test structures comprises at least two test structures that are different from one another with respect to at least one attribute of the set of attributes characterizing the test structures;
 determining an inductance of each test structure;
 formulating a reference inductance data set from the determined inductances of the set of test structures, wherein the reference inductance data set is curve-fit according to values of the attributes characterizing each test structure; and
 determining an inductance of an interconnect segment in the integrated circuit by identifying the interconnect segment with a curve point in the curve-fit reference inductance data.

32. The method of claim 31, wherein the set of test structures comprises a plurality of test structures each representing a metal layer of the plurality of metal layers, wherein the signal line of each representing test structure is on the represented metal layer.

33. The method of claim 31, wherein the set of test structures comprises a plurality of test structures each having a different ground grid density.

34. The method of claim 31, wherein the set of test structures comprises a plurality of test structures each having a different layer association of the respective signal line.

35. The method of claim 31, wherein the set of test structures comprises a plurality of test structures each having a different width of the respective signal line.

36. The method of claim 31, wherein the set of test structures comprises a plurality of test structures each having a different length of the respective signal line.

37. A method for characterizing interconnect impedance properties of a technology for fabricating an integrated circuit, comprising:
 providing a set of fabricated test structures, wherein each test structure comprises a ground grid and a signal line, the signal line being characterized at least by its layer association among a plurality of metal interconnect layers, the plurality of metal interconnect layers being each represented by at least one test structure in that the signal line of the one test structure is associated only with the respective metal interconnect layer represented; and
 determining a unit impedance with respect to the respective signal line in each test structure.

38. The method of claim 37, wherein the plurality of metal interconnect layers include all metal interconnect layers defined in the technology.

39. The method of claim 38, wherein the plurality of metal interconnect layers include at least five layers including a top metal layer, the ground grid of each test structure being in the top metal layer.

40. The method of claim 37, wherein determining the unit impedance of each test structure comprises performing a frequency domain scattering-parameter (S-parameter) measurement of the respective test structure.

41. The method of claim 37, wherein the signal line of each test structure is further characterized by its line width, and wherein at least one of the plurality of metal interconnect layers is represented by a subset of the set of test structures in that the signal lines of the subset are all associated only with the respective metal interconnect layer represented, and the signal lines of the subset have various line widths.

42. The method of claim 37, wherein each test structure is characterized by attributes comprising layer association of its signal line, grid density of its ground grid, and line width of its signal line, the method further comprising:

formulating a reference impedance data set from the determined unit impedance properties of the set of test structures, wherein the reference impedance data set is curve-fit according to values of the attributes; and determining an impedance property of an interconnect segment in the integrated circuit by identifying the interconnect segment with a curve point in the curve-fit reference impedance data.

43. The method of claim 42, wherein the values of the attributes are sufficiently diverse such that a CAD tool can scan a design layout of an integrated circuit to obtain a scan result, compare the scan result with the curve, and approximately determine an impedance property of an interconnect segment in the integrated circuit.

44. A set of fabricated test structures used for characterizing interconnects of an integrated circuit fabricated according to a technology profile defining a metal layer configuration having at least a first, a second, a third, a fourth, and a top metal layer, the fabricated set of test structures comprising:

a first subset of fabricated test structures each comprising a ground grid formed in the top metal layer and a signal line formed in the first metal layer;

a second subset of fabricated test structures each comprising a ground grid formed in the top metal layer and a signal line formed in the second metal layer;

a third subset of fabricated test structures each comprising a ground grid formed in the top metal layer and a signal line formed in the first metal layer; and a fourth subset of fabricated test structures each comprising a ground grid formed in the top metal layer and a signal line formed in the fourth metal layer;

wherein each subset of fabricated test structures comprises at least two test structures that are each characterized by values of a set of attributes predetermined according to the technology profile, such that the two structures are different from one another with respect to at least one attribute but both still within a range determined by the technology profile.

45. The set of test structures of claim 44, wherein the signal line of each subset of test structures is associated with the respective metal layer only.

46. The set of test structures of claim 44, wherein the signal line of each subset of test structures is connected to an external pad with a via.

47. The set of test structures of claim 44, wherein the metal layer configuration further has a fifth metal layer, the set of test structures further comprising:

a fifth subset of fabricated test structures each comprising a ground grid formed in the top metal layer and a signal line formed in the top metal layer.

48. The set of test structures of claim 44, wherein each subset of test structures further comprises:

additional fabricated test structures each being characterized by values of the set of attributes, such that the set of test structures has sufficient diversity with respect to the set of attributes to represent the technology profile.

49. The set of test structures of claim 44, wherein the set of attributes characterizing each test structure include:

layer location of the respective ground grid among the plurality of metal layers;

grid density of the respective ground grid;

layer association of the respective signal line among the plurality of metal layers;

width of the respective signal line; and length of the respective signal line.

50. The set of test structures of claim 44 adapted for S-parameter measurement, wherein the ground grid and the signal line of each test structure are used as two separate ports for making an S-parameter measurement.

51. The set of test structures of claim 44, further comprising a standard structure comprising a ground grid and a signal line both formed in the top metal layer.

52. The set of test structures of claim 44, wherein the set of test structures further comprises a de-embedding test structure.

53. The set of test structures of claim 52, wherein the de-embedding test structure comprises an open circuit structure in which the signal line comprises two pads separated from one another forming an open circuit.

54. The set of test structures of claim 53, wherein the open circuit structure further comprises an open ground grid comprising ground pads separated from one another forming an open circuit.

* * * * *